United States Patent [19]

Mead et al.

[11] Patent Number: 5,049,758
[45] Date of Patent: Sep. 17, 1991

[54] ADAPTABLE CMOS WINNER-TAKE ALL CIRCUIT

[75] Inventors: Carver A. Mead, Pasadena; Timothy P. Allen, Palo Alto, both of Calif.

[73] Assignee: Synaptics, Incorporated, San Jose, Calif.

[21] Appl. No.: 608,972

[22] Filed: Oct. 31, 1990

Related U.S. Application Data

[60] Division of Ser. No. 486,336, Feb. 28, 1990, which is a continuation-in-part of Ser. No. 282,176, Dec. 9, 1988, Pat. No. 4,935,702.

[51] Int. Cl.$^5$ ............... H03K 17/687; H03K 19/14; G11C 11/40
[52] U.S. Cl. ......................... 307/246; 307/311; 307/351; 323/316; 357/23.5; 365/185
[58] Field of Search ............. 307/246, 311, 264, 482, 307/578, 278, 350, 351; 323/316, 317; 330/288; 357/23.5; 365/185

[56] References Cited

U.S. PATENT DOCUMENTS

| | | | |
|---|---|---|---|
| 4,403,192 | 9/1983 | Williman | 307/357 X |
| 4,665,426 | 5/1987 | Allen et al. | 357/23.5 X |
| 4,767,979 | 8/1988 | Tanigawa | 323/316 |
| 4,799,195 | 1/1989 | Iwahashi et al. | 365/210 X |
| 4,935,702 | 6/1990 | Mead et al. | 330/253 X |

Primary Examiner—Stanley D. Miller
Assistant Examiner—Toan Tran
Attorney, Agent, or Firm—Kenneth D'Alessandro

[57] ABSTRACT

An integrated circuit amplifier having a random input offset voltage is adaptable such that the input offset voltage may be cancelled out. An inverting input node is a floating input node and is coupled to a source of input signal by a first capacitor. A second capacitor is connected between the output of the amplifier and the floating node. An ultraviolet window above the second capacitor allows the floating node to be charged, by the application of ultraviolet light, to a voltage which effectively cancels the input offset voltage. The ultraviolet window and capacitor electrodes are arranged such that the ultraviolet light may strike only the desired areas of the structure.

1 Claim, 11 Drawing Sheets

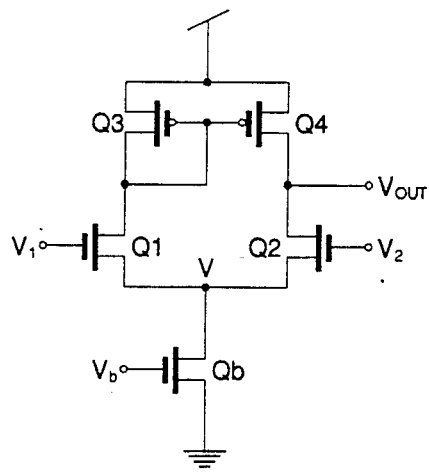
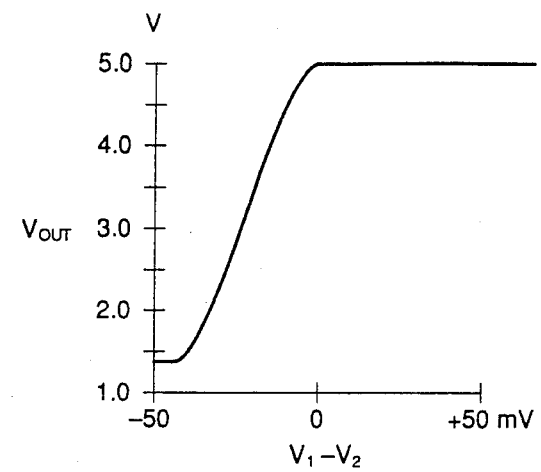
FIGURE 1A
PRIOR ART
FIGURE 1B
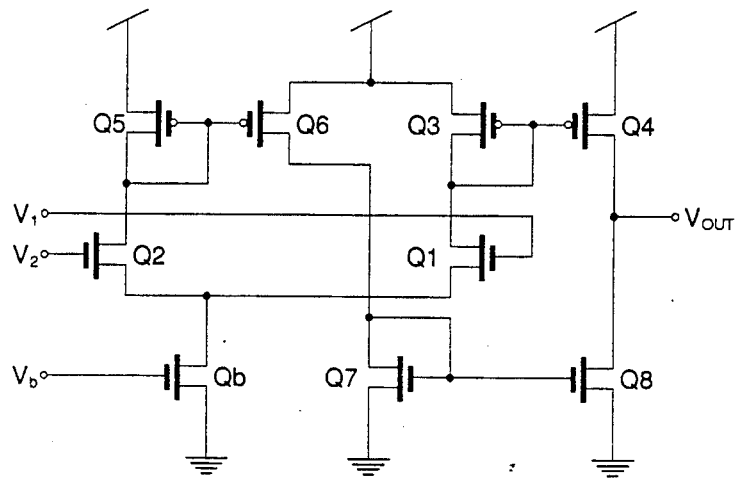
FIGURE 1C
PRIOR ART
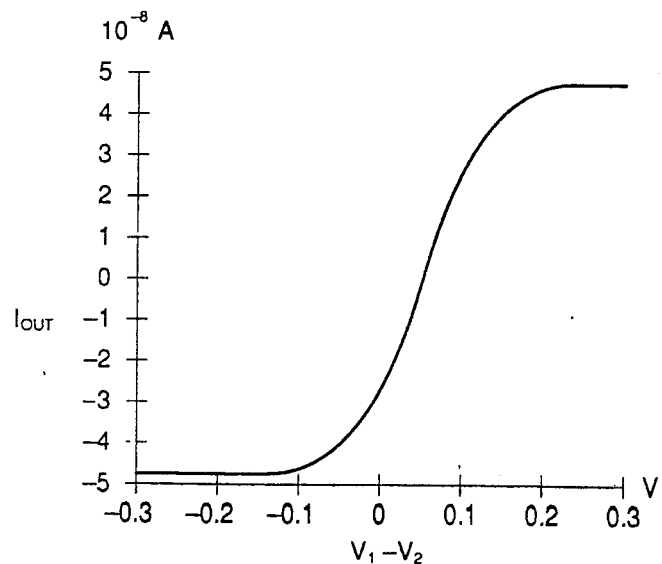
FIGURE 1D

ADAPTABLE CMOS WINNER-TAKE ALL CIRCUIT

This application is a division of application Ser. No. 486,336, filed Feb. 28, 1990, which is a continuation-in-part of application Ser. No. 282,176, filed Dec. 9, 1988, now U.S. Pat. No. 4,935,702.

BACKGROUND OF THE INVENTION

1. Field Of The Invention

The present invention relates to electronic circuits. More specifically, the present invention relates to adaptive circuits.

2. The Prior Art

It has recently become apparent that large-scale analog circuits can be achieved using conventional CMOS technology. The key to achieving very high levels of complexity in an analog system is to operate the individual transistors in their subthreshold region, where the drain current is an exponential function of the gate-source voltage. In this regime of operation, amplifiers can be operated with current levels in the range from $10^{-12}$ A to $10^{-7}$ A. At these low currents, the drain current of the individual transistors saturates at drain voltages above 100 to 200 Mv, allowing analog operation with the same power-supply voltages commonly employed for digital circuits (0-5 V in 1988). Because of the low power-supply voltage and low current level the total power dissipated by an individual amplifier is extremely small, making possible large-scale systems employing $10^4$ or more amplifiers.

Despite the numerous advantages of subthreshold operation, very few systems outside of the electronic watch industry have taken advantage of this mode of operation. The major problems that have prevented application of subthreshold amplifiers have been their input offset voltage and the limited input voltage range.

BRIEF DESCRIPTION OF THE INVENTION

The present invention addresses both the input range and input offset problems, and makes possible the adaptation of analog CMOS technology to a much wider range of applications.

An analog MOS integrated circuit comprises an amplifier circuit having a gain much larger than 1. The inverting input into one stage of this amplifier circuit is a floating node forming the gate of at least one MOS transistor. A first capacitor couples an input of the circuit to this floating node and a second capacitor is connected from an output of the amplifier to this floating node. A window or opening in the metal layers above the second capacitor allows ultraviolet light to fall onto both electrodes of the capacitor, thus allowing the offset voltage of the amplifier to be adapted while the source of ultraviolet light is present.

BRIEF DESCRIPTION OF THE DRAWINGS

FIGS. 1a-1d are schematic diagrams and transfer curves of prior art CMOS transconductance amplifiers.

FIG. 5b is a top view of a typical layout for the circuit depicted in FIG. 5a.

DETAILED DESCRIPTION OF A PREFERRED EMBODIMENT

Figure 2A:
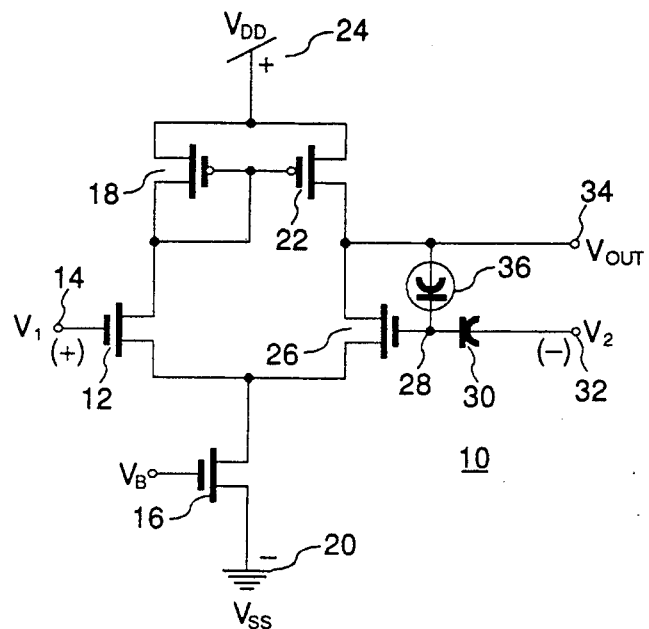
FIG. 2a and 2b are schematic diagrams of one embodiment of an amplifier according to the present invention.

Referring first to FIG. 1a, a typical CMOS transconductance amplifier as known in the prior art is shown. FIG. 1b is a transfer curve for the amplifier circuit of FIG. 1a. FIG. 1b illustrates a typical input-offset voltage condition which is characteristic of the amplifier FIG. 1a. Note that when $V_1 = V_2$, the output of the amplifier is at a voltage of 5 volts, equal to the voltage on one of the power supply rails. As shown in FIG. 1b, the active region of the amplifier lies in the region where the input voltage $V_1 - V_2$ is the range from about $-50$ millivolts to zero. Those of ordinary skill in the art will readily recognize that, depending on the particular offset voltages of the individual transistors, the transfer curve of FIG. 1b for any given amplifier could be shifted to either the right or the left on the X axis of FIG. 1b.

Those of ordinary skill in the art will also recognize that the circuit of FIG. 1 suffers from another drawback. That is, when the voltage $V_{out}$ is less than the voltage V, the transistor Q₂ will stop conducting and the output voltage will no longer be a function of the differential input voltage.

The circuit of FIG. 1c, also known in the prior art, is meant to overcome the second difficulty mentioned with respect to the circuit of FIG. 1a. In the circuit of FIG. 1c, the current mirror comprising Q₃ and Q₄ and the current mirror comprising Q₅ and Q₆ isolate the output stages from the input stages, thus allowing the output voltage to be free of the dependence on the input voltage exhibited by the circuit of FIG. 1a.

The circuit of FIG. 1c also suffers from the input offset voltage problem noted with respect to the circuit of FIG. 1a. This may be seen by examination of FIG. 1d, a typical transfer curve of the circuit shown in FIG. 1c. It will be observed that the linear portion of the transfer curve ($I_{out}$ vs $V_{in}$) is not symmetrical about the $V_1 = V_2$ position on the curve. For any individual amplifier circuit, the transfer curve of FIG. 1d may be located at different positions along the X axis due to the random offset voltage inherent in each circuit as a result of its manufacture. Because of the input offset voltage, the amplifier has an output current when the input voltage difference is zero. Since these amplifiers are often used as differential amplifiers, where they are connected so as to utilize the output current as a measure of the input voltage difference, it is clear that the offset voltage prevents the amplifier from operating as intended.

Those of ordinary skill in the art will note that a third drawback, common to the circuits of FIGS. 1a and FIG. 1c, is that the range of input voltages for which the output transfer function is approximately linear is very small. When used as a current output device, as shown in FIG. 1d, the range of output voltage for which the transfer function is approximately linear is restricted to a range of differential input voltage less than 200 millivolts. When used as a voltage output device, the range of operation is even smaller (FIG. 1b). This factor, coupled with the random input offset voltage exhibited by the circuits of FIG. 1a and 1c, severely restricts the applications to which such circuits may be put.

The present invention provides a solution to the input offset voltage problem and the limited input voltage range inherent in prior art transconductance amplifier circuits like those of FIGS. 1a and 1c.

Referring now to FIG. 2a, an amplifier 10 according to the present invention may be achieved by modification of the amplifier circuit of FIG. 1a. A first N-channel MOS input transistor 12 has its gate connected to a non-inverting input node 14, its source connected to the drain of an N-channel MOS bias transistor 16, and its drain connected to the drain and gate of a first P-channel current mirror transistor 18. The source of N-channel MOS bias transistor 16 is connected to a source of fixed negative voltage $V_{ss}$, shown as ground at reference numeral 20 in FIG. 2a, and its gate is connected to a source of bias voltage $V_b$. The drain and gate of first P-channel current mirror transistor 18 is also connected to the gate of second P-channel current mirror transistor 22. The sources of first and second P-channel current mirror transistors 18 and 22 are connected to a source of fixed positive voltage 24, shown as $V_{DD}$ in FIG. 2a.

A second N-channel MOS input transistor 26 has its gate connected to a floating node 28. A first capacitor 30 has as its first electrode floating node 28 and as its second electrode an inverting input node 32. The source of second N-channel MOS input transistor 26 is connected to the drain of N-channel MOS bias transistor 16, and the drain of second N-channel MOS input transistor 26 is connected to an output node 34 and to the drain of second P-channel current mirror transistor 22. A second capacitor 36 has as its first electrode floating node 28 and as its second electrode output node 34.

Floating node 28 is preferably formed from a first polysilicon layer in a double polysilicon layer process and may be referred to as a floating gate. The electrodes of capacitors 30 and 36 are formed from floating gate 28 and from a second layer of polysilicon.

An ultraviolet "UV" window 38 formed in an otherwise opaque second metal layer lies above the capacitor electrode of capacitor 36 formed by floating node 28. This UV window will be further described with respect to FIGS. 4a–4f.

The circuit of FIG. 2a is identical to the circuit shown in FIG. 1a, except that transistor 26 has a floating gate, and is coupled to the inverting input node 32 only by capacitor 30, and to the output node 30 by capacitor 36.

For ease of analysis, it is first assumed that there are no offset voltages in the circuit, and that when $V_1$ and $V_2$ are fixed at a voltage $V_0$, $V_{out}$ is also $V_0$. In the analysis, all voltages will be referenced to $V_0$. As the positive input voltage $V_1$ is increased from $V_0$, the output voltage will increase due to the gain A of the amplifier according to equation [1] where $f$ is the voltage on the floating gate 28:

$$V_{out} = A(V_1 - V_f) \quad [1]$$

This increase in output voltage will induce a charge on capacitor 36 (referred to in equations herein as "$C_{36}$"), thus increasing the voltage $V_f$ on the floating gate. The charge relationships in the circuit are:

$$C_{36}(V_{out} - V_f) = C_{30}(V_f - V_2) \quad [2]$$

Eliminating $V_f$ from equations [1] and [2], yields:

$$V_{out} \left[ 1 + \frac{1}{A}\left(1 + \frac{C_{30}}{C_{36}}\right)\right] = V_1\left(1 + \frac{C_{30}}{C_{36}}\right) - V_2 \frac{C_{30}}{C_{36}} \quad [3]$$

When A is very large compared to $$\frac{C_{36}}{C_{30}},$$

the overall gain of the amplifier with this arrangement becomes independent of A, as is well known from the feedback amplifier art. Under these conditions, the amplifier becomes very linear, and its gain is set by the values of the two capacitors 36 and 30, which employ the silicon oxide dielectric between two layers of polysilicon. Because this oxide is thermally grown at a high temperature in a typical CMOS process, its properties are among the best controlled parameters in the entire process. The areas of the capacitors can be controlled by the area of one of the layers, and thus can be made independent of the alignment between layers. The floating-gate feedback-controlled amplifier is thus an ideal match to the capabilities of the CMOS technology.

Figure 2B:
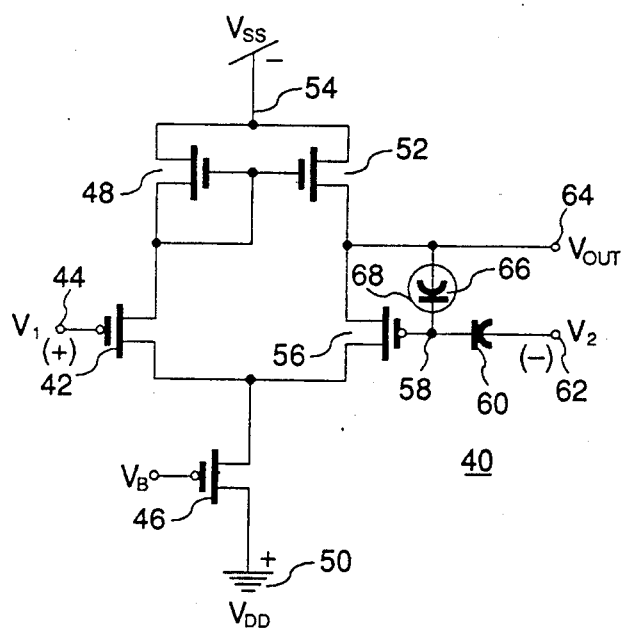

Referring now to FIG. 2b, another amplifier 40 according to the present invention may be achieved by further modification of the amplifier circuit of FIG. 1a by reversing all of the transistor conductivity types and voltages. Thus, a first P-channel MOS input transistor 42 has its gate connected to a non-inverting input node 44, its source connected to the drain of a P-channel MOS bias transistor 46, and its drain connected to the drain and gate of a first N-channel current mirror transistor 48. The source of P-channel MOS bias transistor 46 is connected to a source of fixed positive voltage $V_{DD}$, shown as ground at reference numeral 50 in FIG. 2b, and its gate is connected to a source of bias voltage $V_b$. The drain and gate of first N-channel current mirror transistor 48 is also connected to the gate of second N-channel current mirror transistor 52. The sources of first and second N-channel current mirror transistors 48 and 52 are connected to a source of fixed negative voltage 54, shown as $V_{SS}$ in FIG. 2b.

A second P-channel MOS input transistor 56 has its gate connected to a floating node 58. A first capacitor 60 has as its first electrode floating node 58 and as its second electrode a non-inverting input node 62. The source of second P-channel MOS input transistor 56 is connected to the drain of P-channel MOS bias transistor 46, and the drain of second P-channel MOS input transistor 56 is connected to an output node 64 and to the drain of second N-channel current mirror transistor 52. A second capacitor 66 has as its first electrode floating node 58 and as its second electrode output node 64.

As in the embodiment of FIG. 2a, floating node 58 is preferably formed from a first polysilicon layer in a double polysilicon layer process and may be referred to as a floating gate. The electrodes of capacitors 60 and 66 are formed from floating gate 58 and from a second layer of polysilicon.

A UV window 68 formed in an otherwise opaque second metal layer lies above the capacitor electrode of capacitor 68 formed by floating node 28. This UV window will be further described with respect to FIGS. 4a–4f.

Those of ordinary skill in the art will recognize that the difference between the embodiments of FIGS. 2a and 2b is that the positions of the N-channel and P-channel transistors, and power supply polarities have been reversed. Otherwise, the operation of the circuit depicted in FIG. 2b is identical to the operation of the circuit depicted in FIG. 2a, and the disclosure of circuit operation with respect to the circuit of FIG. 2a will suffice for those of ordinary skill in the art as a disclosure of the operating principals of the circuit of FIG. 2b.

Figure 3A:
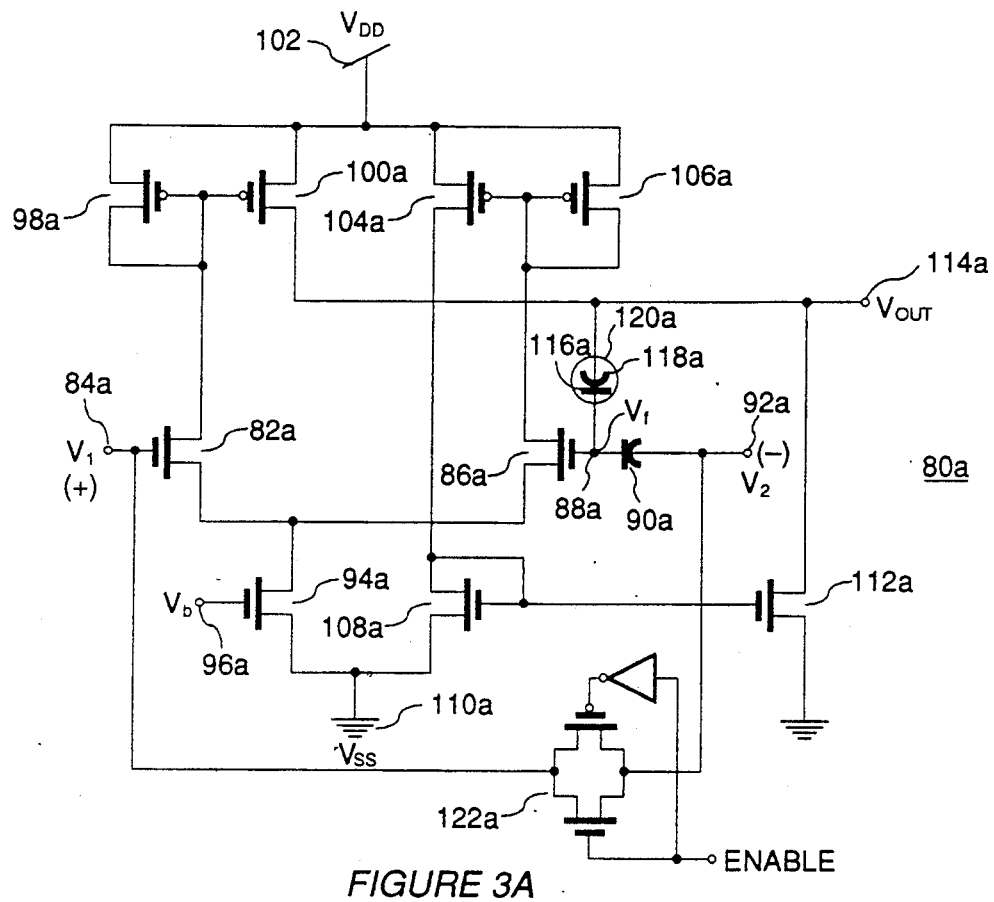
FIG. 3a is a schematic diagram of a presently-preferred embodiment of a CMOS amplifier with automatic offset adaptation according to the present invention.

Referring now to FIG. 3a, a presently-preferred embodiment of a CMOS transconductance amplifier according to the present invention is shown. CMOS transconductance amplifier 80a includes a first N-channel MOS input transistor 82a having its gate connected to a non-inverting input node 84a and a second N-channel MOS input transistor 86a having its gate 88a connected through a capacitor 90a (referred to in equations herein as "C90") to an inverting input node 92a. Capacitor 90a is formed by the gate node 88a of second N-channel MOS input transistor 86a, which is an electrically-isolated, or "floating" gate, preferably formed by a first polysilicon layer, and a second polysilicon layer connected to inverting input node 92a. A silicon dioxide insulating layer forms the preferred dielectric of capacitor 90a between the first and second polysilicon layers.

The sources of first N-channel input transistor 82a and second N-channel input transistor 86a are commonly connected to the drain of an N-channel transistor 94a having its gate connected to a source of bias voltage $V_b$, shown at reference numeral 96a, and its source connected to a source of negative voltage 110a. The drain of first N-channel input transistor 82a is connected to a first current mirror consisting of first P-channel current mirror transistor 98a and second P-channel current mirror transistor 100a. The gates of P-channel current mirror transistors 98a and 100a are commonly connected to the drain of first N-channel input transistor 82a and to the drain of first P-channel current mirror transistor 98a. The sources of P-channel current mirror transistors 98a and 100a are commonly connected a source of positive voltage $V_{DD}$, shown at reference numeral 102a.

The drain of second N-channel input transistor 86a is connected to a second current mirror consisting of third and fourth P-channel current mirror transistors 104a and 106a, respectively. The gates of third and fourth P-channel current mirror transistors 104a and 106a are commonly connected to the drain of first N-channel input transistor 86a as well as to the drain of fourth P-channel current mirror transistor 106a. The sources of third and fourth P-channel current mirror transistors 104a and 106a are commonly connected to $V_{DD}$. The drain of third P-channel current mirror transistor 104a is connected to the gate and drain of N-channel transistor 108a. The source of N-channel transistor 108a is connected to a source of negative voltage $V_{SS}$, shown as ground at reference numeral 110a in FIG. 3a.

N-channel transistor 108a and N-channel transistor 112a form a third current mirror. The gate of N-channel transistor 112a is connected to the gate of N-channel transistor 108a. The source of N-channel transistor 112a is connected to the source of negative voltage $V_{SS}$, shown as ground in FIG. 3a. The drain of N-channel transistor 112a is connected to the drain of N-channel current mirror transistor 100a forming the output node 114a of amplifier 80a.

The floating gate 88a of second N-channel input transistor 86a forms a capacitor electrode 116a of capacitor 118a, the other electrode being formed by or connected to the diffused regions which form the drains of N-channel transistor 112a and P-channel transistor 100a and the contacts and metal layers which connect them together, at the output node 114a of the transconductance amplifier 80a.

A UV window 120a formed in an otherwise opaque second metal layer lies above the capacitor electrode 116a. This UV window will be further described with respect to FIGS. 4a–4f.

The circuit of the preferred embodiment of the present invention shown in FIG. 3a is identical to the circuit shown in FIG. 1c, except that transistor 86a (equivalent to transistor $Q_2$ of FIG. 1a) has a floating gate, and is coupled only by capacitor 90a to the negative input node 92a, $V_2$, and by capacitor 118a to the output node 114a, $V_{out}$. For ease of analysis, it is first assumed that there are no offset voltages in the circuit, and that when $V_1$ and $V_2$ are fixed at a voltage $V_0$, $V_{out}$ is also $V_0$. In the analysis, all voltages will be referenced to $V_0$. As the positive input voltage $V_1$ is increased from $V_0$, the output voltage will increase due to the gain A of the amplifier according to equation [4] where $V_f$ is the voltage on the floating gate 86a:

$$V_{out} = A(V_1 - V_f) \quad [4]$$

This increase in output voltage will induce a charge on capacitor 118a (referred to in equations herein as "$C_{118}$"), thus increasing the voltage $V_f$ on the floating gate. The charge relationships in the circuit are:

$$C_{118}(V_{out} - V_f) = C_{90}(V_f - V_2) \quad [5]$$

Eliminating $V_f$ from equations [4] and [5], yields:

$$V_{out}\left[1 + \frac{1}{A}\left(1 + \frac{C_{90}}{C_{118}}\right)\right] = V_1\left(1 + \frac{C_{90}}{C_{118}}\right) - V_2\frac{C_{90}}{C_{118}} \quad [3]$$

When A is very large compared to $$\frac{C_{118}}{C_{90}},$$

the overall gain of the amplifier with this arrangement becomes independent of A, as is well known from the feedback amplifier art. Under these conditions, the amplifier becomes very linear, and its gain is set by the values of the two capacitors 118a and 90a, which employ the silicon oxide dielectric between two layers of polysilicon. Because this oxide is thermally grown at a high temperature in a typical CMOS process, its properties are among the best controlled parameters in the entire process. The areas of the capacitors can be controlled by the area of one of the layers, and thus can be made independent of the alignment between layers. The floating-gate feedback-controlled amplifier is thus an ideal match to the capabilities of the CMOS technology.

Those skilled in the art will notice that FIG. 3a is an amplifier with a capacitive divider circuit on the inverting input. Amplifiers of this type, with capacitively coupled inputs, are used widely in applications where only the AC (high-frequency) components of the input signal are passed through the capacitive divider and amplified. If this capacitive divider is implemented on a MOS integrated circuit using a thermally-grown oxide layer as the dielectric of the capacitors $C_{90}$ and $C_{118}$, then DC signals, as well as AC signals, will be passed through this divider circuit. This is because the characteristic cutoff frequency of the input divider stage (the frequency below which the network sharply attenuates the inputs) is determined by the size of the two capacitors in relation to the size of any current paths (resistances, current sources, etc....) connected to the center node of the divider circuit. Since the center node of this circuit is imbedded in thermally-grown oxide, which permits no charge whatsoever to leave this node, there are no current paths connected to this node. This means that the cutoff frequency is zero, and the formula commonly used to describe the capacitive voltage divider for AC signals:

$$V_{out} = V_{in}\frac{C_1}{C_1 + C_2},$$

holds for DC voltages as well. In short, this AC-coupled amplifier, when implemented as a MOS integrated circuit, will work as a DC amplifier as well.

This arrangement has not been widely used because the floating gate potential is not well controlled. Using the techniques of the present invention, the floating gate potential can be precisely set.

Figure 3B:
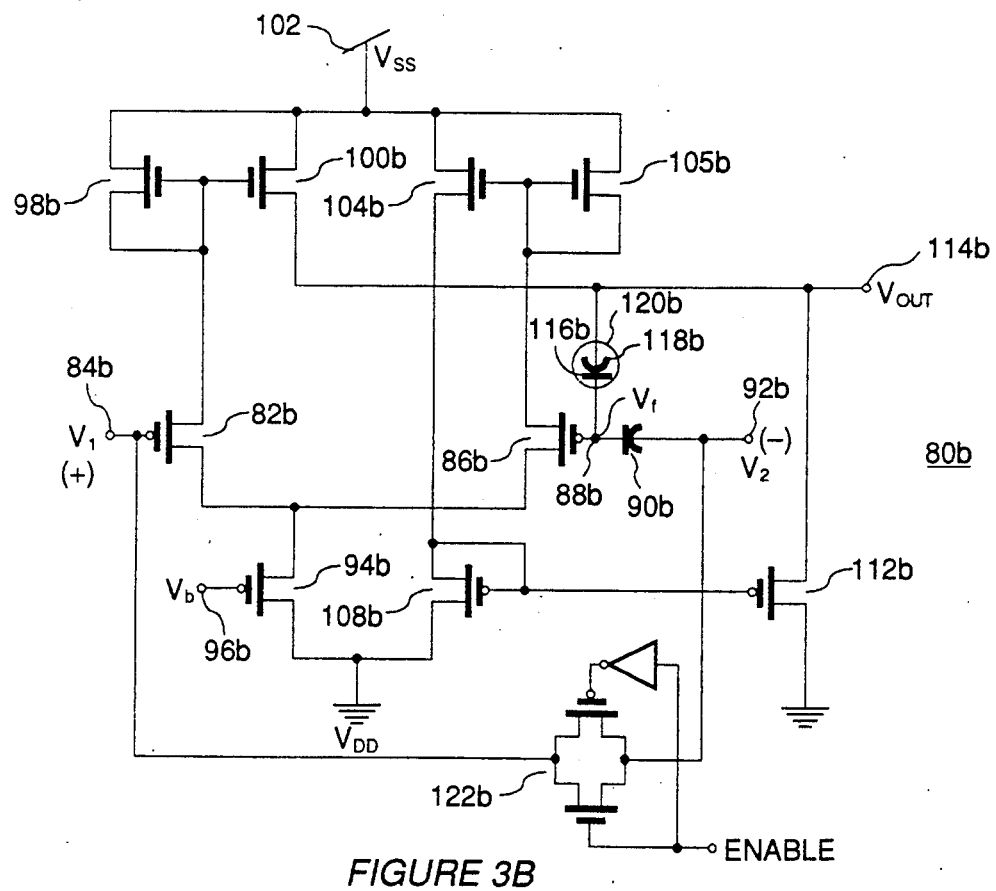
FIG. 3b is a schematic diagram of an alternate embodiment of a CMOS amplifier with automatic offset adaptation according to the present invention.

Referring now to FIG. 3b, an alternative embodiment of a CMOS transconductance amplifier according to the present invention is shown. CMOS transconductance amplifier 80b includes a first P-channel MOS input transistor 82b having its gate connected to a non-inverting input node 84b and a second P-channel channel MOS input transistor 86b having its gate 88b connected through a capacitor 90b (referred to in equations herein as "$C_{90b}$") to an inverting input node 92b. Capacitor 90b is formed by the gate node 88b of second P-channel MOS input transistor 86b, which is an electrically-isolated, or "floating" gate, preferably formed by a first polysilicon layer, and a second polysilicon layer connected to inverting input node 92b. A silicon dioxide insulating layer forms the preferred dielectric of capacitor 90b between the first and second polysilicon layers.

The sources of first P-channel input transistor 82b and second P-channel input transistor 86b are commonly connected to the drain of a P-channel transistor 94b having its gate connected to a bias input node 96b. The drain of first P-channel input transistor 82b is connected to a first current mirror consisting of first N-channel current mirror transistor 98b and second N-channel current mirror transistor 100b. The gates of N-channel current mirror transistors 98b and 100b are commonly connected to the drain of first P-channel input transistor 82b and to the drain of first N-channel current mirror transistor 98b. The sources of N-channel current mirror transistors 98b and 100b are commonly connected a source of negative voltage $V_{SS}$, shown at reference numeral 102b.

The drain of second P-channel input transistor 86b is connected to a second current mirror consisting of third and fourth N-channel current mirror transistors 104b and 106b, respectively. The gates of third and fourth N-channel current mirror transistors 104b and 106b are commonly connected to the drain of first P-channel input transistor 86b as well as to the drain of fourth N-channel current mirror transistor 106b. The sources of third and fourth N-channel current mirror transistors 104b and 106b are commonly connected to $V_{SS}$. The drain of third N-channel current mirror transistor 104b is connected to the gate and drain of P-channel transistor 108b. The source of P-channel transistor 108b and the source of P-channel transistor 94b are commonly connected to a source of positive voltage $V_{DD}$, shown as ground at reference numeral 110 in FIG. 3b.

P-channel transistor 108b and P-channel transistor 112b form a third current mirror. The gate of P-channel transistor 112b is connected to the gate of P-channel transistor 108b. The source of P-channel transistor 112b is connected to the source of positive voltage $V_{DD}$, shown as ground in FIG. 3b. The drain of P-channel transistor 112b is connected to the drain of P-channel current mirror transistor 100b forming the output node 114b of amplifier 80b.

The floating gate 88b of second P-channel input transistor 86b forms a capacitor electrode 116b of capacitor 118b, the other electrode being formed by or connected to the diffused regions which form the drains of P-channel transistor 114b and N-channel transistor 100b and the contacts and metal layers which connect them together, at the output node 114b of the transconductance amplifier 80b. An ultraviolet "UV" window 120b formed in an otherwise opaque second metal layer lies above the by capacitor electrode 116b. This UV window will be further described with respect to FIGS. 4a-4f.

Those of ordinary skill in the art will recognize that the difference between the embodiments of FIGS. 3a and 3b is that the positions of the N-channel and P-channel transistors, and power supply polarities have been reversed. Otherwise, the operation of the circuit depicted in FIG. 3b is identical to the operation of the circuit depicted in FIG. 3a, and the disclosure of circuit operation with respect to the circuit of FIG. 3a will suffice for those of ordinary skill in the art as a disclosure of the operating principals of the circuit of FIG. 3b.

Figure 4A:
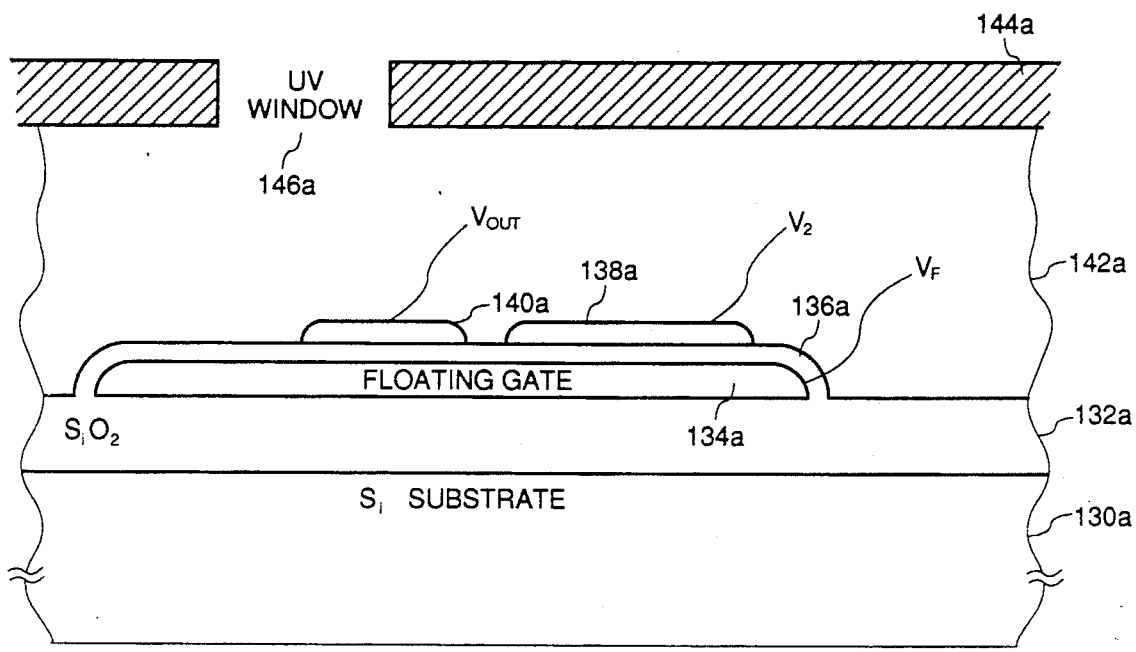
FIG. 4a is a cross-sectional view of a portion of the circuit of FIG. 3a, showing the location of the floating gate capacitors and the ultraviolet window.

Referring now to FIG. 4a, a cross sectional view of the preferred semiconductor structure of the portion of FIG. 3a in the region of the floating gate is shown. This circuit may be fabricated utilizing conventional CMOS fabrication techniques, well understood by those of ordinary skill in the art. The entire circuit is fabricated on silicon substrate 130a, in which n-type regions are diffused to form the sources and drains of the N-Channel devices and n-wells are formed into which p-type diffusion regions are formed to form the sources and drains of the P-channel devices. As understood by those of ordinary skill in the art, p-well techniques may be used instead of n-well techniques.

The surface of the silicon substrate 130a is covered with a layer of oxide 132a in a conventional manner. A first layer of polysilicon is deposited on top of the silicon dioxide layer 132a and then defined using conventional deposition, masking, and etching techniques to form floating gate 134a. Once floating gate 134a has been formed, a second layer of oxide 136a is grown over floating gate 134a. A second layer of polysilicon is then deposited on top of oxide layer 136a and formed into regions 138a and 140a using conventional deposition, masking, and etching techniques.

Region 138a forms one of the electrodes of capacitor 90a of FIG. 3a and region 140a is connected to output node 112a (FIG. 3a) via a metal contact. After second level polysilicon regions 138a and 140a have been defined, another insulating layer 142a is deposited over the second polysilicon layer. A first metal layer (not shown), for use as interconnections as is well understood by those of ordinary skill in the art, is next deposited and defined. After deposition of another insulating layer above the first metal layer, a second metal layer 144a is deposited and UV windows 146a are etched into the second metal layer 144a. The UV windows are centered directly above the edge of the upper second polysilicon region 140a, which is connected to the output node 114a. Second level metal layer 144a should be connected to a fixed potential, preferably ground or $V_{DD}$. The first and second metal layers may be formed from any metal suitable for semiconductor fabrication.

It is important that the UV coupling exist only to the node which is fed back from the output, and not to other extraneous voltages which would cause error. Therefore, it is important to avoid coupling the floating node to unwanted voltage. It is also important that the opaque layer cover all active circuit areas which would otherwise be affected by the presence of UV light.

Figure 4B:
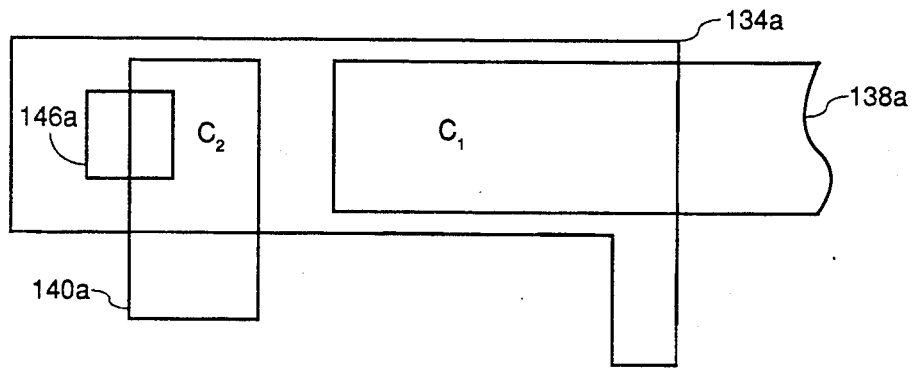
FIG. 4b is a top view of the circuit of FIG. 4a, showing the location of the floating gate capacitors and the ultraviolet window.

FIG. 4b is a top view of the structure shown in FIG. 4a. In FIG. 4b the spatial relationship between floating gate 134a and second level polysilicon regions 138a and 140a and ultraviolet window 146a can be more easily seen.

Those of ordinary skill in the art will readily recognize that additional geometry within the circuit layout may be used to form and/or enhance these capacitances. The placement of these capacitors is thus a design choice within the skill of one of ordinary skill in the art.

In certain applications where maximum precision is required, an annular adaptation structure is desireable. Such a structure minimizes the leakage of UV light to other edges where unwanted adaptation can otherwise take place, and maximizes the edge perimeter for desired adaptation. FIGS. 4c-4f depict alternate annular embodiments of the geometry which may be employed in the practice of the present invention.

Figure 4C:
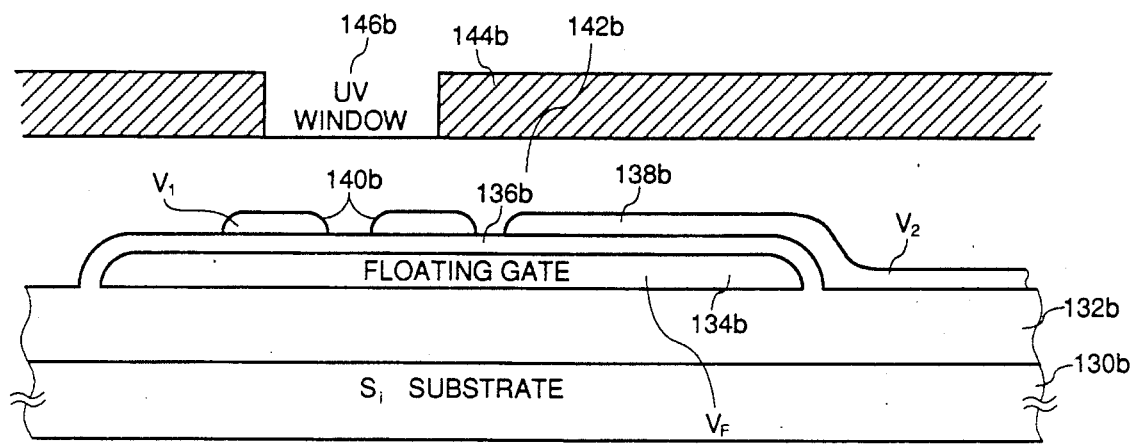
FIG. 4c is a cross-sectional view of a variation of a portion of the circuit of FIG. 3a, showing the location of the floating gate capacitors and the ultraviolet window.

Referring first to FIG. 4c, a cross-sectional view of an alternate geometry for an embodiment of the present invention, in the region of the floating gate is shown. Like the circuit depicted in FIG. 4a, this circuit may also be fabricated utilizing conventional CMOS fabrication techniques, well understood by those of ordinary skill in the art. The entire circuit is fabricated on silicon substrate 130b, in which n-type regions are diffused to form the sources and drains of the N-Channel devices and n-wells are formed into which p-type diffusion regions are formed to form the sources and drains of the P-channel devices.

The surface of the silicon substrate 130b is covered with a layer of oxide 132b in a conventional manner. A first layer of polysilicon is deposited on top of the silicon dioxide layer 132b and then defined using conventional deposition, masking, and etching techniques to form floating gate 134b. Once floating gate 134b has been formed, a second layer of oxide 136b is grown over floating gate 134b. A second layer of polysilicon is then deposited on top of oxide layer 136b and formed into region 138b and annular region 140b using conventional deposition, masking, and etching techniques.

Region 138b forms one of the electrodes of capacitor 90a of FIG. 3a and annular region 140b is connected to output node 114a (FIG. 3a) via a metal contact. After second level polysilicon regions 138b and 140b have been defined, another insulating layer 142b is deposited over the second polysilicon layer. A first metal layer (not shown), for use as interconnections as is well understood by those of ordinary skill in the art, is next deposited and defined.

After deposition of another insulating layer above the first metal layer, a second metal layer 144b is deposited and UV windows 146b are etched into the second metal layer 144b. The UV windows are centered directly above the inner edge of the annulus of upper second polysilicon region 140b, which is connected to the output node 114a of the amplifier in FIG. 3a. If second polysilicon annular region 140b is thought of as a doughnut or square or rectangle containing an aperture, it can be seen that the UV window 146b is centered above the hole in the doughnut or rectangle. Second level metal layer 1464b should be connected to a fixed potential, preferably ground or $V_{DD}$.

Figure 4D:
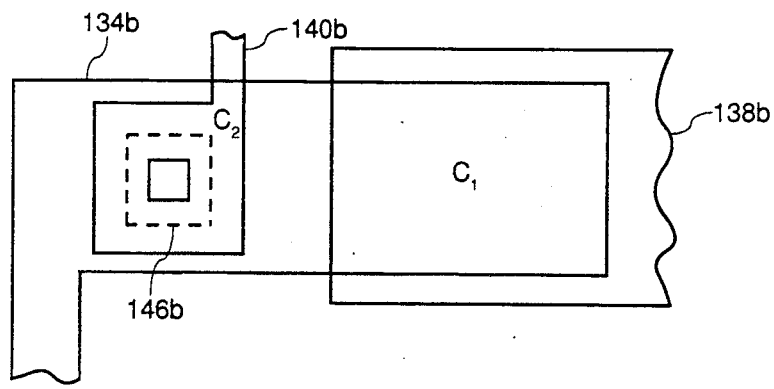
FIG. 4d is a top view of a portion of the circuit of FIG. 4c, showing the location of the floating gate capacitors and the ultraviolet window.

FIG. 4d is a top view of the structure shown in FIG. 4c. In FIG. 4c the aforementioned spatial relationship between floating gate 134b and second level polysilicon region 138b and annular second level polysilicon region 140b and ultraviolet window 146b can be more easily seen. In this embodiment, the annular structure assures that the UV coupling exists only to the node which is fed back from the output, and not to other extraneous voltages which would cause error. In this embodiment it is also important that the opaque layer (here, metal layer 144b) cover all active circuit areas which would otherwise be affected by the presence of UV light.

Figure 4E:
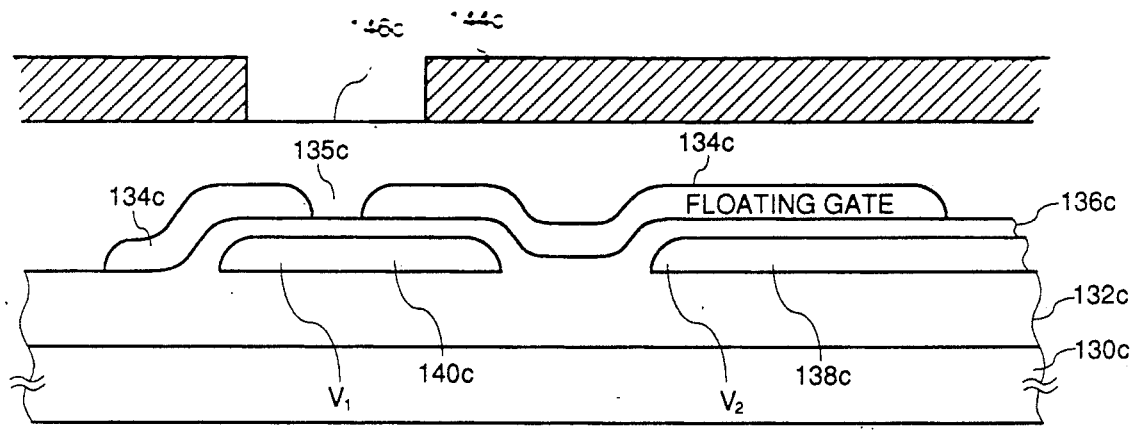
FIG. 4e is a cross-sectional view of a portion of another variation of the circuit of FIG. 3a, showing the location of the floating gate capacitors and the ultraviolet window.

Referring now to FIG. 4e, a cross-sectional view of an alternate geometry for an embodiment of the present invention, in the region of the floating gate is shown. Like the circuits depicted in FIGS. 4a-4d, this circuit may also be fabricated utilizing conventional CMOS fabrication techniques, well understood by those of ordinary skill in the art. The entire circuit is fabricated on silicon substrate 130c, in which n-type regions are diffused to form the sources and drains of the N-Channel devices and n-wells are formed into which p-type diffusion regions are formed to form the sources and drains of the P-channel devices.

The surface of the silicon substrate 130c is covered with a layer of oxide 132c in a conventional manner. A first layer of polysilicon is deposited on top of the silicon dioxide layer 132c and then defined using conventional deposition, masking, and etching techniques. However, unlike the embodiment of FIGS. 4a-4d, in which the first polysilicon layer is formed into a floating gate, in the embodiment of FIGS. 4e-4f the first polysilicon layer is formed into regions 138c and 140c. Region 138c forms one of the electrodes of capacitor 90a of FIG. 3a and region 140c is connected to output node 114a (FIG. 3a) via a metal contact.

Once regions 138c and 140c have been formed, a second layer of oxide 136c is grown over them as shown in FIG. 4e. A second layer of polysilicon is then deposited on top of oxide layer 136c and formed into floating gate 134c using conventional deposition, masking, and etching techniques. Floating gate 134c has an aperture 135c located in it at a position such that the aperture lies over first polysilicon region 140c. A first metal layer (not shown), for use as interconnections as is well understood by those of ordinary skill in the art, is next deposited and defined.

After deposition of another insulating layer above the first metal layer, a second metal layer 146c is deposited and UV windows 146c are etched into the second metal layer 144c. The UV windows are centered directly above the aperture 135c in floating gate 134c, which is connected to the output node 114a of the amplifier in FIG. 3a. Second level metal layer 144c should be connected to a fixed potential, preferably ground or $V_{DD}$.

Figure 4F:
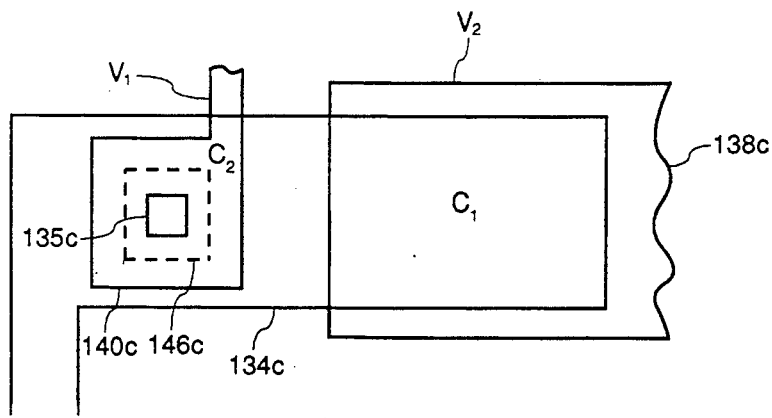
FIG. 4f is a top view of a portion of the circuit of FIG. 4e, showing the location of the floating gate capacitors and the ultraviolet window.

FIG. 4f is a top view of the structure shown in FIG. 4e. In FIG. 4f the aforementioned spatial relationship between floating gate 134c, its aperture 135c, first level polysilicon regions 138c and 140c and ultraviolet window 146c can be more easily seen. In this embodiment, as in the embodiment of FIGS. 4c-4d, the annular structure (here the aperture in the floating gate positioned above region 140c) assures that the UV coupling exists only to the node which is fed back from the output, and not to other extraneous voltages which would cause error.

A key feature of the present invention is that the effect of offset voltages can be nulled out using the circuit structure shown in FIG. 3a. In order to null the offset voltage of the amplifier of FIG. 3a, the circuit is biased to the current where it will be operated, and the two inputs, nodes 84a and 92a, are connected together to a source of voltage in the range where the circuit will be operated.

A means must be provided for forming this connection, and can be, for example, an analog pass gate, well known in the art. Referring again to FIG. 3a, pass gate 122a is shown connected between non-inverting input node 84a and inverting input node 92a. pass gate 122a is a conventional pass gate consisting of a P-channel MOS transistor and an N-channel MOS transistor connected in parallel. An line signal is connected directly to the gate of the N-channel MOS transistor and is connected through an inverter to the gate of the P-channel MOS transistor. A suitable enable signal is provided to pass gate 122a when it is desired to connect non-inverting input node 84a to inverting input node 92a in accordance with the procedure described herein. Pass gate 122b, shown in FIG. 3b, operates in exactly the same manner as pass gate 122a. These same pass gates may be used in the same manner with the amplifiers of the present invention depicted in FIGS. 2a and 2b.

Alternatively, it may be desireable to compensate for offsets in circuitry providing input to the differential amplifier. These prior circuit stages can be arranged to be in a state that should provide zero differential output if the circuits were perfect. The amplifier is then adapted with UV light, and the output is thereafter a function of the deviation of the input from these predefined conditions.

Once nodes 84a and 92a have been connected together, or the prior circuitry set in a state of balance, the chip is then exposed to a source of UV photons of energy greater than 3.2 electron-volts. This energy is sufficient to excite electrons from the capacitor electrodes into the conduction band of the silicon dioxide insulator. This mechanism of electron excitation is well known, and is used to erase the charge on the floating gates of logic transistors in programmable read-only memories.

In the circuit of FIG. 3a, the UV excited electrons flow from the most negative electrode of $C_{118a}$ to the most positive electrode. By the negative feedback action of the amplifier, the output is driven to a voltage which is very close to the value of $V_2$ and $V_1$. Once the offset voltage has been thus nulled, the two inputs can be disconnected from the voltage source in order that the amplifier can be used in a true differential mode; it will have its offset greatly reduced. This technique thus allows the construction of practical analog circuits operating at micropower levels on low power-supply voltages.

The amplifier in the circuit of the present invention need not be a differential amplifier. In an alternate embodiment, shown in FIG. 5a, an amplifier is formed by two transistors connected as an ordinary CMOS inverter. The common gate of the upper and lower transistors is a floating gate, and is capacitively coupled to the input through a first capacitor and to the output through a second capacitor.

In order to null the offset of this amplifier, the input is set to some reference potential $V_{ref}$. When UV illumination is applied, the output is coupled to the input, and output voltage tends to stabilize at the crossover point, i.e., the point at which the output voltage equals the input voltage. This balanced voltage $V_{inv}$, the voltage at which this occurs, will be approximately midway between the positive and negative power supply rails, in the region of high gain for the amplifier. Once the amplifier is thus adapted, the output voltage will be defined as:

$$V_{out} = V_{inv} + A(V_{in} - V_{ref}) \quad [5]$$

After adaptation, the output of the circuit will be $V_{inv}$ (the inverter crossover voltage) when the input voltage is $V_{ref}$.

Figure 5A:
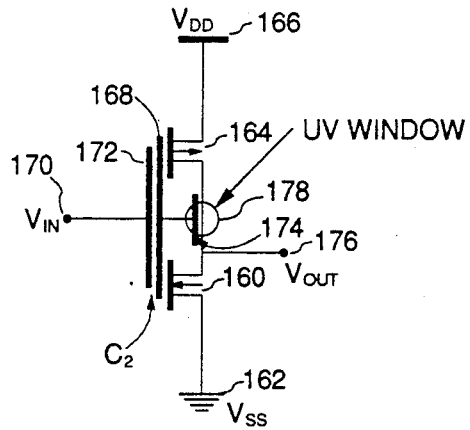
FIG. 5a is a schematic diagram of an alternate embodiment of the present invention wherein the amplifier is a simple inverter.

Referring now to FIG. 5a, an N-channel transistor 160 has its source connected to a source of negative potential $V_{SS}$ (shown at reference numeral 162 as ground in FIG. 5a) and its drain connected to the drain of a first P-channel transistor 164. The source of P-channel transistor 164 is connected to a source of positive voltage $V_{DD}$, shown at reference numeral 166. Floating gate 168 is common to both N-channel transistor 160 and P-channel transistor 164. Floating gate 168 is coupled to an input node 170 by a first capacitor, one electrode of which is floating gate 168 and the other electrode of which is shown at reference numeral 172. A region 174 of floating gate 168 forms one electrode of a second capacitor. The other electrode of the second capacitor is formed by the output node 176 of the circuit. An ultraviolet window 178 is located above this second capacitor.

Figure 5B:
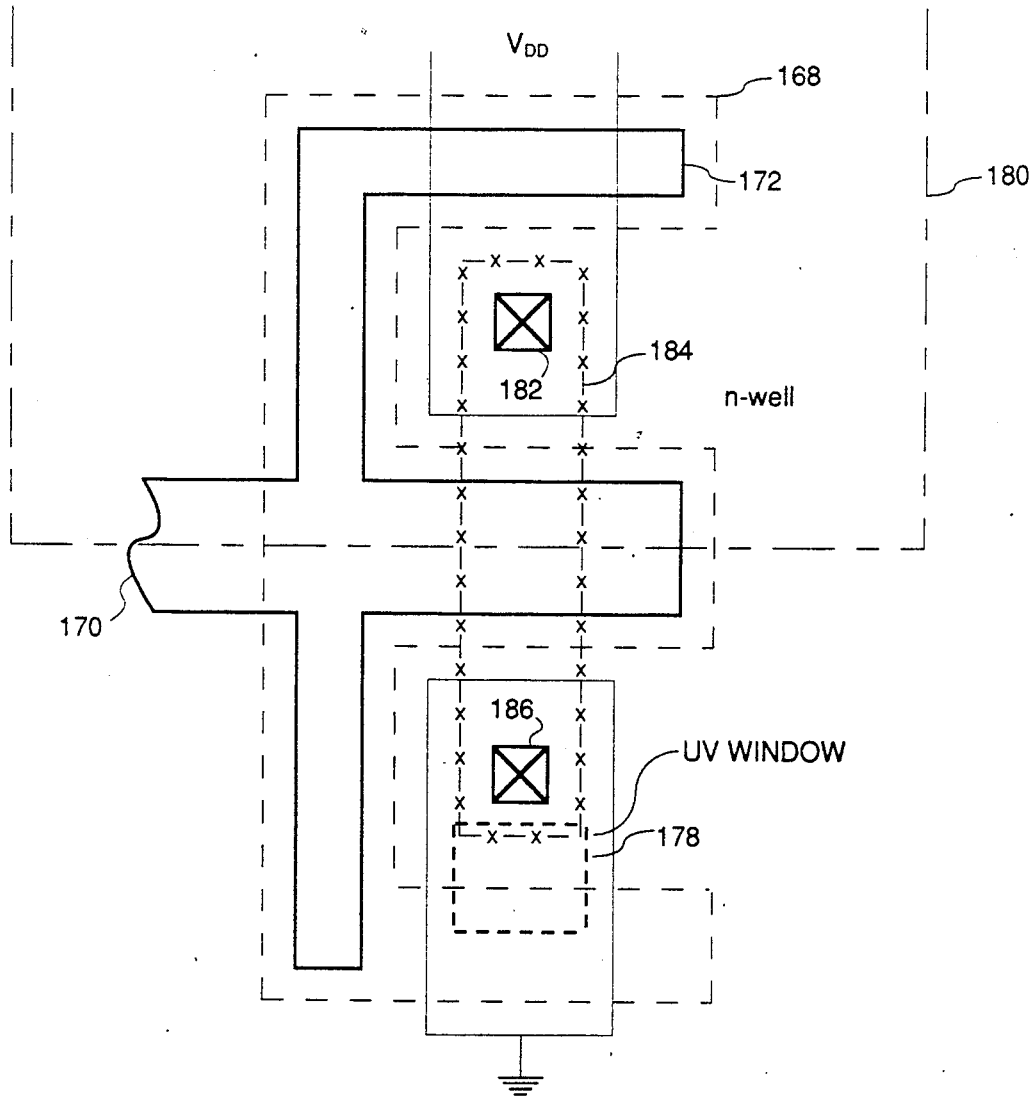

The circuit of FIG. 5a may be further understood with reference to FIG. 5b, a top view of a typical physical layout of the circuit of FIG. 5a. P-channel transistor 164 is formed in n-well 180. The top leg of floating gate 168 forms the gate for the P-channel transistor 164, which is overlain by capacitor electrode 172, which is connected to input node 170. A metal contact 182 connects the drain diffusion of P-channel transistor 164 to a portion 184 of the metal layer which is in turn connected, via a contact 186, to the drain diffusion of N-channel transistor 160. The lower leg of floating gate 168 forms the gate for N-channel transistor 160.

The first capacitor is formed by the entirety of floating gate 168 and the entirety of capacitor electrode 172. The second capacitor consists of several parasitic elements, including the inherent capacitance between metal layer 184, the floating gate 168 and the inherent capacitance between the drain diffusions of N-channel transistor 160 and P-channel transistor 164 and the floating gate 168. UV window 178 is preferably placed over the portion of the second capacitor where the drain diffusion of N-channel transistor 160 meets the floating gate.

The circuits of FIGS. 1a and 1c, are also often used as transconductance amplifiers, in which the output current is employed rather than the open-circuit output voltage. The measured current-transfer characteristic of the hyperbolic tangent, and the useful range of input voltage difference over which the output current is affected by the input, is only about plus and minus 100 mV. More important, the input offset voltage is an appreciable fraction of the entire effective input voltage range. For this reason, the applications in which the amplifier can be used are extremely limited. Although the data shown in FIG. 1d are from the circuit of FIG. 1a, curves from the circuit of FIG. 1c are similar, except the output voltage range is wider. For that reason, the circuit of FIG. 1c is to be preferred where space permits. Both of these circuits are well known in the prior art.

Figure 6A:
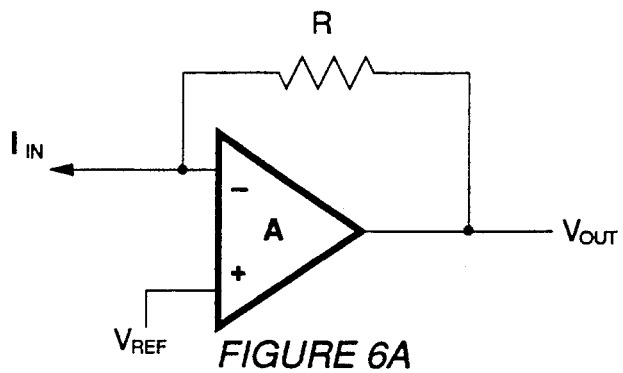
FIGS. 6a and 6b are block diagrams of prior art current sense amplifiers.

In circumstances where the output voltage will remain fixed, the feedback capacitance from the output to the inverting input node can be supplemented by a capacitance to either the non-inverting input or to a low impedance source of a fixed potential. This capacitance, with the input capacitance, forms a capacitance voltage divider, thereby reducing the input voltage difference and thus expanding the horizontal scale of the curve of FIG. 1d. This expansion has the effect of providing a wider linear input range which can be used to minimize or eliminate the effects of the saturation of the output current. The reason why this has not been done previously is that the voltage on the floating node has not been well controlled and the input offset voltage would be larger than the achievable range of input voltage variation; thus the output current would be saturated. Using the teachings of the present invention, this difficulty is overcome by open circuiting the output of the amplifier and adapting the voltage on the floating node as previously described. Once the voltage on this node is adapted, the output can be reconnected and the amplifier used as a highly linear voltage-to-current converter with low offset. These principles just described can be used in a current-sense amplifier. The purpose of current sense amplifier circuits is to generate an output voltage $V_{out}$ proportional to the input current $I_{in}$. In the prior art, this function would be accomplished using the circuit of FIG. 6a. Assuming a perfect amplifier with voltage gain $A \gg 1$, the output of the circuit is $$V_{out} = V_{ref} + R \cdot I_{in} \qquad [6]$$

For small values of $I_{in}$, this circuit has many drawbacks for production implementation in a standard CMOS process. Resistive material for making precision resistors is not available in most processes. Even if a resistive layer were available, the feedback resistor R would be of a fixed value, and could not be adjusted during operation to match the range of currents to be sensed, which can vary over many orders of magnitude.

Figure 6B:
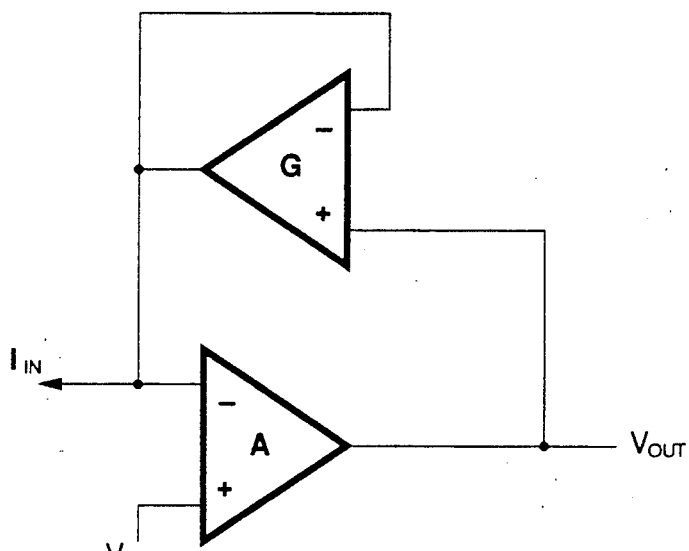

In order to achieve a feedback element capable of having its value adjustable over many orders of magnitude, a follower-connected transconductance amplifier known in the prior art, as shown in FIG. 6b may be used. The amplifier labeled G has a current output dependent upon voltage difference between output and input node according to the relationship shown in FIG. 1d. The current scale can be adjusted over orders of magnitude by setting the bias control Vb of the G amplifier. The problem with this circuit is that the output voltage range is limited to plus or minus $\sim 100$ Mv for the linear range of operation. If a current is sensed which is greater than the bias current in the G amplifier, the current output of the G amplifier will saturate and $V_{out}$ will slam against one of the power-supply rails. $V_{out}$ is thus not a well-behaved function of $I_{in}$.

Figure 6C:
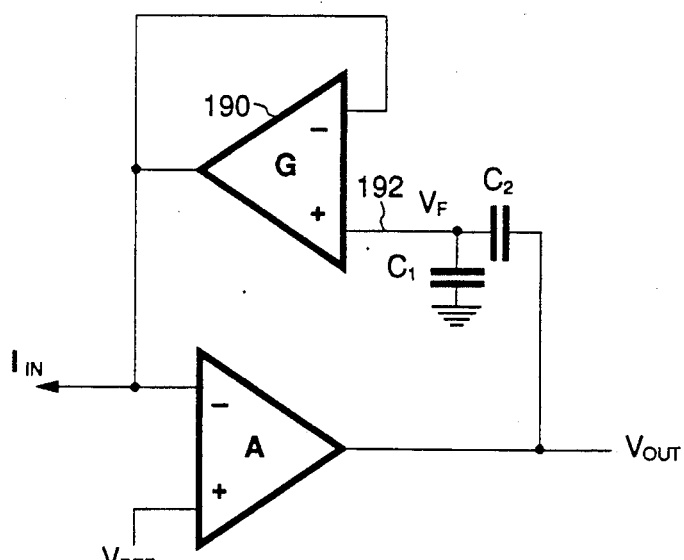
FIGS. 6c and 6d are block diagrams of current-sense amplifiers which are suitable for use in the present invention.

In order to overcome the current-saturation behavior of the G amplifier, a capacitive voltage divider may be used, as shown in FIG. 6c, to reduce the input voltage range of amplifier 190 according to the present invention. This arrangement has the effect of spreading the voltage range of the tanh characteristic of FIG. 1d by the factor $(C_1 + C_2)/C_2$. The problem with this circuit is, of course, that the input offset voltage of the G amplifier may saturate the amplifier at maximum output current, independent of $V_{out}$.

In order to compensate the effects of offset voltage, the same technique which is used in the circuits shown in FIGS. 2a, 2b, 3a, and 3b may be used. The input node $V_f$ (reference numeral 192) to the G amplifier is a floating node, and can be adapted with UV light to compensate out the offset voltage of the G amplifier. A UV window structure similar to that shown in FIG. 3a or FIGS. 4a–4f over the $C_2$ capacitor must be provided. By setting the input current to zero and exposing the circuit to UV light, the output voltage can be driven to $V_{ref}$ (within one offset voltage of the A amplifier). The same technique with more complex switching schemes can also be a amplifier as well.

Figure 6D:
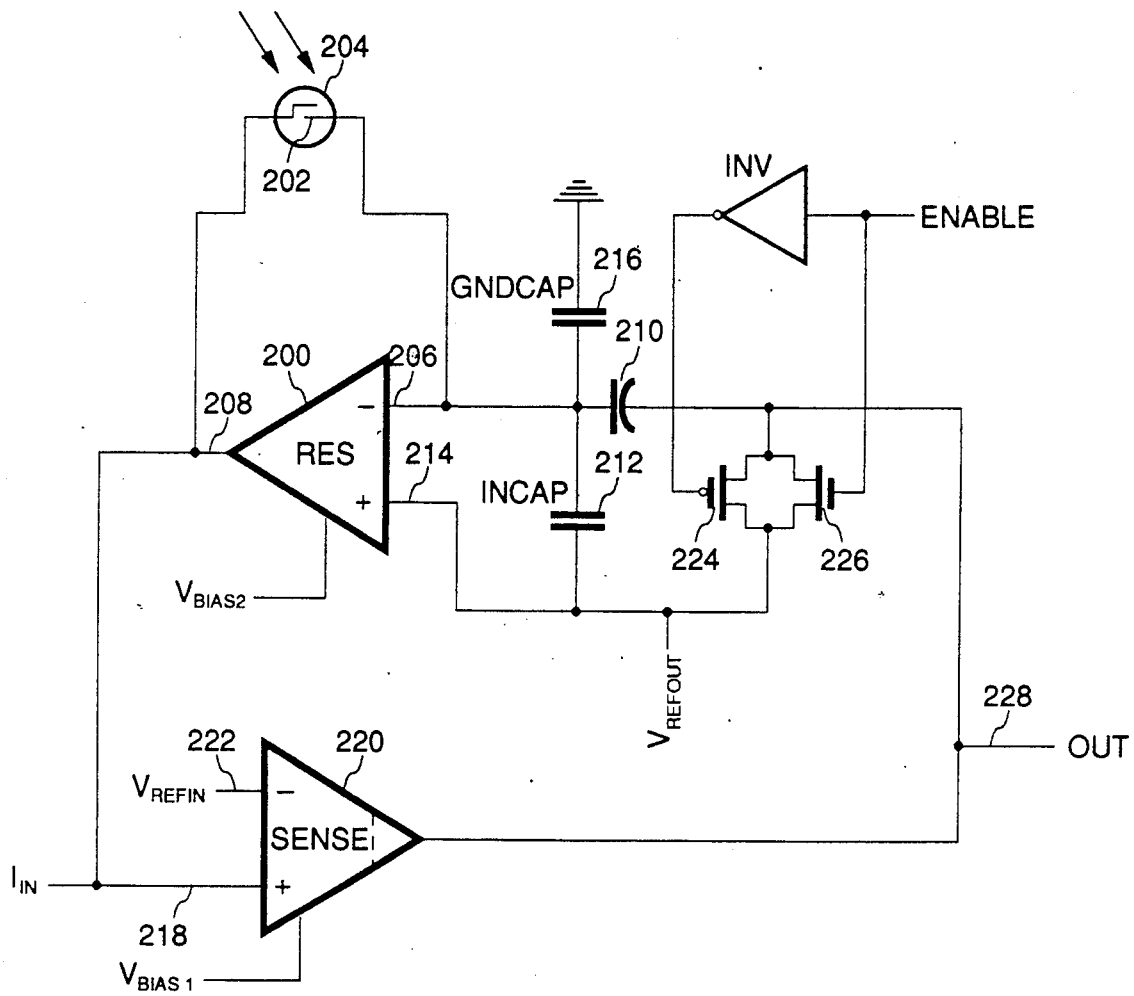

In order to further reduce the effects of input offset voltage, the circuit of FIG. 6d may be used. In FIG. 6, the adaptable amplifier 200 has a capacitor 202 with overlying UV window 204 in an otherwise opaque layer connected between its inverting input 206 and its output 208. Capacitor 210 makes inverting input 206 a floating node. Capacitor 212 between the inverting input 206 and non-inverting input 214, and capacitor 216, between the inverting input and ground, form an input voltage divider to set the input range. The output 208 of amplifier 200 is connected to the non-inverting input 218 of amplifier 220. The inverting input 222 of amplifier 22 is connected to a source of reference voltage $V_{refin}$. Those of ordinary skill in the art will notice that, as in the circuit of FIG. 3a, a conventional passgate, comprising P-channel transistor 224 and N-channel transistor 226, is connected between the inverting input 206 and non-inverting input 214 of amplifier 200.

In the circuit of FIG. 6d, the gain of amplifier 200 further reduces the input offset. In the circuit of FIG. 6d, the voltage ($V_{refin}$) at the inverting input 222 to amplifier 220 is chosen to be the voltage at which it is desired that the non-inverting input of that amplifier 200 should be set. The $V_{bias1}$ input sets the current drive capability for driving the output node 228. The $V_{bias2}$ voltage sets the slope of the current output of the amplifier, as is shown in graph of FIG. 1b, by setting the vertical axis scale. The voltage $V_{refout}$ sets the quiescent point for $V_{out}$.

The ratio of capacitors 202, 212 and 216 to capacitor 210 sets the gain of the amplifier and, by setting the ratio, the linear range of operation may be altered. For example, if a 100 mv input voltage range will saturate the output at both power supply rails, a ratio of 50:1 will expand the input range to 5 volts.

Figure 7:
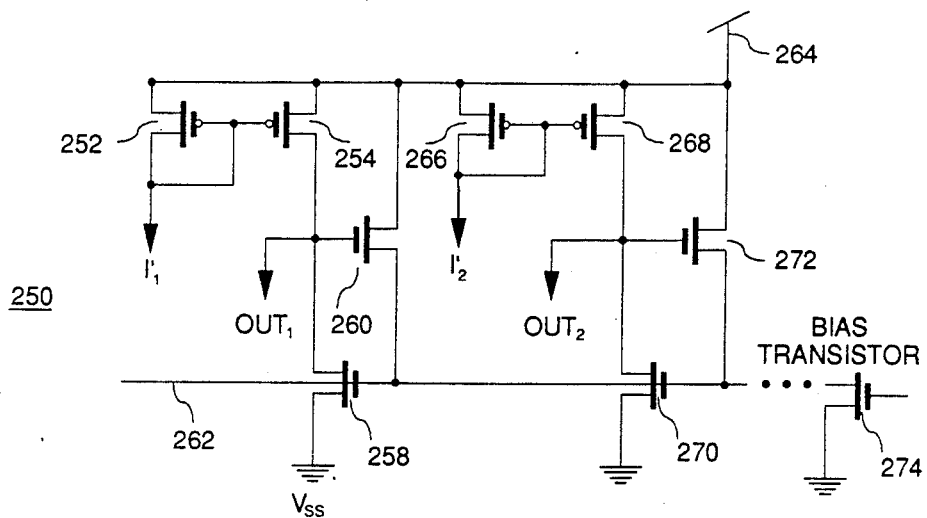
FIG. 7 is a schematic diagram of a prior art "winner-take-all" circuit useful in the environment of the present invention.

Referring now to FIG. 7, a generally useful circuit known as a "winner-take-all" circuit is shown. The operation of this circuit is completely disclosed in co-pending application Ser. No. 277,795, filed Nov. 30, 1988, which is expressly incorporated herein by reference.

In FIG. 7, winner-take-all circuit 250 includes a plurality of sections, two of which are shown. In the first section, a current mirror consists of P-channel current mirror MOS transistor 252 and P-channel MOS current mirror transistor 254. The drain of P-channel current mirror transistor 254 is connected to the drain of N-channel MOS transistor 256. The source of N-channel MOS transistor 256 is connected to a source of negative voltage, shown at reference numeral 258 in FIG. 7 as $V_{SS}$ or ground.

Another N-channel MOS follower transistor 260 has its source connected to a common gate line 262, its drain connected to a source of positive voltage $V_{DD}$, shown at reference numeral 264, and its gate connected to the common connection of the drain of N-channel MOS transistor 256 and the drain of P-channel MOS current mirror transistor 254. The node to which the gate of N-channel MOS transistor 260 is connected is the output current node for the column of the array of FIG. 7 associated with that section shown in FIG. 7 as $OUT_1$.

The second section of the circuit for the second column includes a current mirror comprising P-channel MOS current mirror transistors 266 and 268 and N-channel MOS transistors 270 and 272, connected in exactly the same manner as are the transistors for the first section. Common gate line 262 is connected to the drain of N-channel MOS transistor 274, whose purpose is to provide a bias current out of common gate line 262.

While the operation of the winner-take-all circuit in FIG. 7 is fully described in co-pending application Ser. No. 277,795 incorporated herein by reference, briefly, follower transistors 260, 272, etc., pull the common gate line 262 up to a voltage at which the saturation current through the common gate pulldown devices 256, 270, etc., is equal to the input current of the winning input. This turns off all sections in the circuit except for the one having the largest current flowing into it.

The circuit of FIG. 7 is very effective in identifying the largest of a number of currents as long as the corresponding transistors in each section are well matched. However, the inevitable mismatches which occur between nominally identical transistors as realized in silicon can cause one section to win even when some other section has higher input current. For this reason, it is desirable to apply the teachings of the present invention to adapt the Winner-take-all circuit such that all sections will win equally (tie) when all input currents are equal, and no particular section will be favored due to transistor mismatch.

Figure 8:
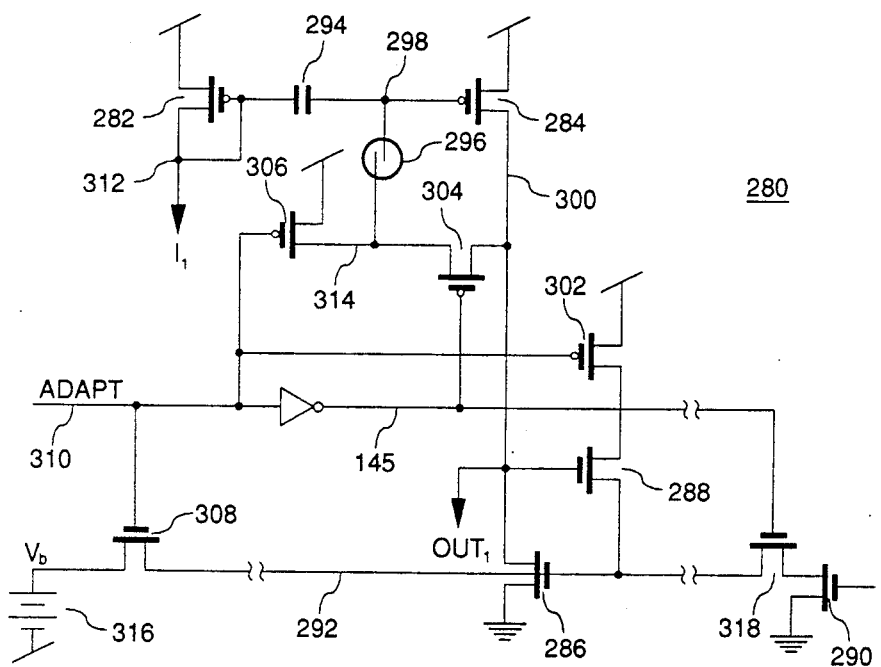
FIG. 8 is a schematic diagram of a presently preferred embodiment of an adaptable "winner-take-all" circuit according to the principles of the present invention.

One section of an adaptive winner-take-all circuit is shown in FIG. 8. In this adaptive winner-take-all circuit 280, P-channel transistor 282 corresponds to P-channel transistor 252 in FIG. 7, P-channel transistor 284 corresponds to P-channel transistor 254 in FIG. 7, N-channel transistor 286 corresponds to N-channel transistor 256 in FIG. 7, N-channel transistor 288 corresponds to N-channel transistor 260 in FIG. 7, N-channel transistor 290 corresponds to N-channel transistor 274 in FIG. 7, and node 292 corresponds to node 262 in FIG. 7.

In addition, capacitor 294 connects the gate of P-channel current mirror transistor 282 to the gate of P-channel current mirror transistor 284, UV adaptation capacitor 296 is used to selectively adapt floating node 298 to the output node 300, and transistors 302, 304, 306, and 308 are used to reconfigure the circuit during adaptation.

The operation of the circuit of FIG. 8 can be understood as follows: when the adapt signal (line 310) is held low, the circuit is configured to be essentially identical to that of FIG. 7. Floating node 298 is coupled to the input node 312 capacitor 294, which is preferably arranged to be much larger than UV adaptation capacitor 296. Since node 314 is held at $V_{DD}$ by transistor 306 when the adapt signal is low, the voltage on floating node 298 will follow the voltage on input node 312 quite closely, with only a small voltage division due to adaptation capacitor 296. Hence the operation of the circuit is identical to that described above.

To adapt the circuit, the circuits generating input currents to all stages of the winner-take-all circuit are arranged to be in an equivalent state, i.e., a state that should be considered to be a tie by the winner-take-all circuit. The adapt signal is raised to $V_{DD}$, and UV light is applied through a UV window to the adaptation capacitor 296. With adapt signal 310 high, the winner-take-all common gate line 292 is held at a preset voltage noted symbolically by battery 316, by the action of transistor 308. Transistor 290 and follower transistor 288 are disconnected from the winner-take-all common gate line 292 by the action of transistor 318 and 302, respectively. Node 314 is connected to output node 300 by the action of transistor 304.

Figure 9:
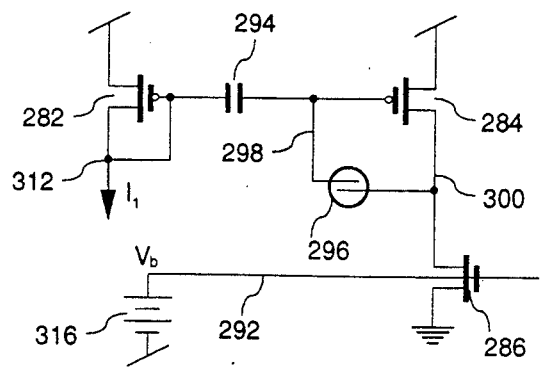
FIG. 9 is a schematic diagram of the equivalent circuit of the circuit of FIG. 8 during adaptation.

Hence, during adaptation, the circuit of FIG. 9 is the equivalent circuit of the circuit shown in FIG. 8. Those of ordinary skill in the art will appreciate the circuit of FIG. 9 to be an inverting amplifier with capacitor 294 in series with its inverting input, and UV adaptation capacitor 296 connected from its output to its floating node, in accord with the teachings of the present invention. It follows that, when UV light is applied to the adaptation capacitors of all stages in the winner-take-all circuit, all outputs will be adapted to very nearly the same voltage. After the adaptation is complete, the UV light is removed, and the adapt control signal 310 is brought low. Thereafter the circuit will function as the circuit of FIG. 8, in which the effects of all offsets, including those of the circuits generating the input currents, are compensated.

It will be appreciated by those of ordinary skill in the art that the adaptation of the winner-take-all circuit is a special case of a generally useful method, which can be appreciated with reference to FIG. 9. During adaptation, the gate of transistor 286 is connected to a source of bias voltage, and the function of transistor 286 is to supply the output current desired from the current mirror when the particular "calibration" input current is present. If the current mirror transistors are operated in their sub-threshold range, where their drain currents are an exponential function of their gate voltages, the effect of adaptation is to fix the ratio of output current to input current at a particular desired value. After adaptation, the source of desired current can be removed and the current mirror can be used for any desired purpose, of which the winner-take-all function is one particularly useful example. For the winner-take-all circuit, it is desireable to connect the second electrode of capacitor 296 to a source of fixed voltage after adaptation is accomplished to avoid capacitive feedback from node 300 to node 298, which can limit the gain of the stage. If the gain set by the ratio of capacitor 294 to capacitor 296 is sufficient, capacitor 296 can remain connected to node 300, and transistors 304 and 306 can be eliminated.

Figure 10:
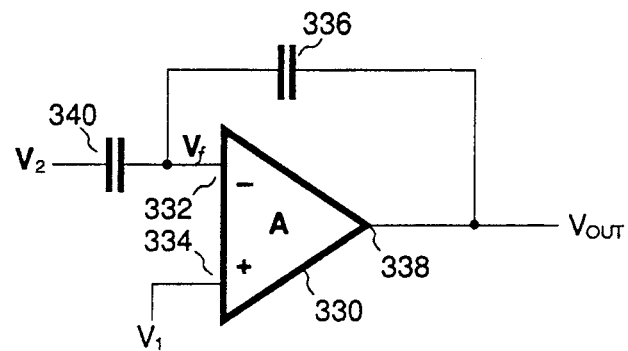
FIG. 10 is an abstract schematic diagram of the embodiments of FIGS. 2a, 2b, 3a, and 3b.

The embodiments of FIGS. 2a, 2b, 3a, and 3b may be shown abstractly in FIG. 10, wherein amplifying element 330, having a gain larger than 1, and having inverting input node 332 and noninvertinq input node 334, may be represented as the familiar triangular shape known to those of ordinary skill in the art. Capacitor 336 has one of its electrodes connected to output node 338 and the other one of its electrodes connected to inverting input node 332. Non-inverting input node 334 is connected to a source of input voltage $V_1$. Capacitor 340 has one of its electrodes connected to inverting input node 332 and the other one of its electrodes connected to a source of input voltage $V_2$. A voltage $V_f$ appears at inverting input node 332.

The circuit of FIG. 10 is adequate to compensate for the offset voltages of any application in which $V_1$ is fixed, but does not function as a true differential amplifier because the two inputs are not equivalent. Assuming that the behavior of amplifier 330 can be described:

$$V_{out} = A \cdot (V_1 - V_f) \quad [7]$$

the output voltage can be expressed in terms of the input voltages $V_1$ and $V_2$ by equation 3, which can be rewritten:

$$V_{out}\left(\frac{C_{336}}{C_{340} + C_{336}} + \frac{1}{A}\right) = V_1 - V_2\left(\frac{C_{340}}{C_{340} + C_{336}}\right) \quad [8]$$

For A much larger than $$\left(\frac{C_{340} + C_{336}}{C_{340}}\right),$$

equation [8] can be rewritten:

$$V_{out}\left(\frac{C_{340}}{C_{336}} + \frac{1}{2}\right)(V_1 - V_2) + \frac{1}{2}(V_1 + V_2) \quad [9]$$

It is thus clear that the common mode gain of the circuit is unity, which is very poor for a differential amplifier, as will be readily understood by those of ordinary skill in the art. The circuit of FIG. 10 can be improved to allow full differential operation as shown in FIG. 11.

Figure 11:
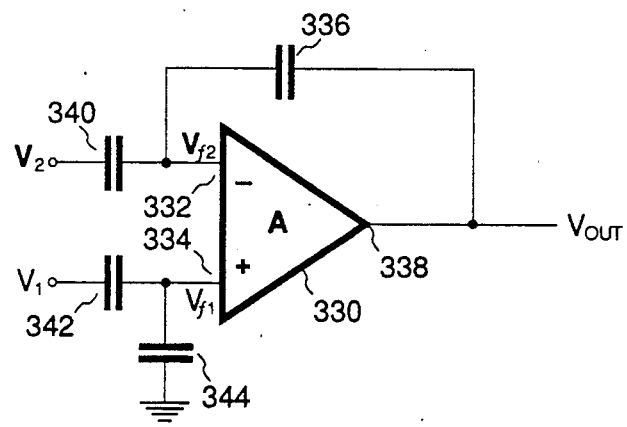
FIG. 11 is an abstract schematic of a circuit like that of FIG. 10 which allows full differential operation.

Referring now to FIG. 11, amplifying element 330 includes inverting input node 332 and non-inverting input node 334, and, like the amplifying element of FIG. 10, has a gain larger than 1 and may be represented as the familiar triangular shape known to those of ordinary skill in the art. Capacitor 336 has one of its electrodes connected to output node 338 and the other one of its electrodes connected to inverting input node 332. Capacitor 340 has one of its electrodes connected to inverting input node 332 and the other one of its electrodes connected to a source of input voltage $V_2$. Capacitor 342 has one of its electrodes connected to non-inverting input node 334 and the other one of its electrodes connected to a source of input voltage $V_1$. Capacitor 344 has one of its electrodes connected to non-inverting input node 334 and the other one of its electrodes connected to a source of fixed voltage, shown as ground in FIG. 11.

It is desired that the amplifying element have no response if $V_1$ and $V_2$ are both raised or lowered by the same amount (zero common-mode gain), which, for the abstraction of the amplifier Described in Equation [7], is equivalent to requiring that $V_{out}$ be a function of $V_2 - V_1$ alone. this condition can be achieved by making $$\frac{C_{342}}{C_{334}} = \frac{C_{340}}{C_{336}} = \frac{1}{\alpha} \quad [10]$$

Under this assumption, using Equation [7] as the abstraction of the amplifier, the output voltage of the circuit of FIG. 11 can be written in terms of V1 and V2:

$$V_{out}\left(\alpha + \frac{1 + \alpha}{A}\right) = V_1 - V_2$$

For $\alpha A$ much larger than $1 + \alpha$, equation [11] reduces to:

$$V_{out} = \frac{1}{\alpha}(V_1 - V_2) \quad [12]$$

In order for the circuit of FIG. 11 to function properly, the voltages $V_{f1}$ and $V_{f2}$ on floating inverting and non-inverting input nodes 332 and 334 must be adapted as taught by the present invention. In the presently preferred embodiment, capacitor $C_{336}$ is adapted with UV light, whereby the offsets inherent in the amplifier are corrected exactly as taught with regard to the amplifiers of FIGS. 2a, 2b, 3a, and 3b.

In addition, some method of stabilizing the voltage $V_{f1}$ during adaptation is desirable. The presently preferred method for adapting $V_{f1}$ is to expose capacitor $C_{342}$ to UV light, thereby making $V_{f1}$ equal to $V_1$ during adaptation. It is also possible to adapt capacitor $C_{344}$, the bottom electrode of which is connected to a source of fixed voltage, to which $V_{f1}$ will be adapted by the action of the UV light.

While presently-preferred embodiments of the present invention have been disclosed herein, those of ordinary skill in the art will be enabled, from the within disclosure, to configure embodiments which although not expressly disclosed herein nevertheless fall within the scope of the present invention. For instance, the transistor types and voltage polarities may all be reversed without departing from the spirit of the present invention. It is therefore, the intent of the inventors that the scope of the present invention be limited only by the appended claims.

What is claimed is:

1. An adaptable circuit, communicating with a plurality of current-carrying lines, for indicating the output of the one of said plurality of current-carrying lines through which the most current is flowing, including:

a plurality of MOS current mirrors, each of said current mirrors including an input node, an output node, a driving MOS current mirror transistor and a driven MOS current mirror transistor, the sources of said driving MOS current mirror transistor and said driven MOS current mirror transistor connected to a source of fixed positive voltage, the gate and drain of each of said driving MOS current mirror transistors comprising said input node and connected to a different one of said current carrying lines and to one electrode of a first MOS capacitor, the gate of said driven MOS current mirror transistor connected to a floating node, the second electrode of said first MOS capacitor comprising a portion of said floating node, drain of said driven MOS current mirror transistor comprising said output node and connected to the gate of said follower transistor, a second MOS capacitor associated with each of said plurality of current mirrors, each said second MOS capacitor having as a first electrode a portion of the floating node in the current mirror with which it is associated, and as a second electrode a second node, a pulldown transistor associated with each of said current mirrors, each of said pulldown transistors having its source connected to a source of fixed negative voltage, and its gate connected to a common pulldown gate line, a pulldown gate bias transistor, having its source connected to said source of negative voltage, its gate connected to a source of bias voltage, a follower transistor associated with each of said current mirrors, having its gate connected to the output of the current mirror with which it is associated, and having a source-drain path connected between a source of fixed voltage and said common pulldown gate line, means for selectively connecting the drain of said pulldown gate bias transistor to said common pulldown gate line, and for enabling said source-drain path of said follower transistor to conduct during an operating mode of said circuit, and for connecting said common pulldown gate line to a source of fixed voltage, for connecting each of said second nodes to the output node of said current mirror with which it is associated, and for disabling said source-drain path of said follower transistor during an adapting mode of said circuit, an opaque layer covering portions of the surface of said integrated circuit containing active circuits, said opaque layer having an aperture therein above said second capacitor for allowing ultraviolet light to fall onto said first and second electrodes of said second capacitor whereby the offset voltages of said circuit can be adapted while a source of ultraviolet light is present during said adapting mode of said circuit.

* * * * *